United States Patent
Hirano

(10) Patent No.: US 9,199,311 B2
(45) Date of Patent: Dec. 1, 2015

(54) COATED CUTTING TOOL

(75) Inventor: Yusuke Hirano, Iwaki (JP)

(73) Assignee: TUNGALOY CORPORATION, Iwaki-shi, Fukushima (JP)

( * ) Notice: Subject to any disclaimer, the term of this patent is extended or adjusted under 35 U.S.C. 154(b) by 85 days.

(21) Appl. No.: 14/112,492

(22) PCT Filed: Apr. 20, 2012

(86) PCT No.: PCT/JP2012/060651
§ 371 (c)(1),
(2), (4) Date: Oct. 17, 2013

(87) PCT Pub. No.: WO2012/144574
PCT Pub. Date: Oct. 26, 2012

(65) Prior Publication Data
US 2014/0044946 A1 Feb. 13, 2014

(30) Foreign Application Priority Data

Apr. 20, 2011 (JP) ................................. 2011-093560

(51) Int. Cl.
| | | |
|---|---|---|
| C23C 16/34 | (2006.01) | |
| B23B 27/14 | (2006.01) | |
| C23C 28/00 | (2006.01) | |
| C23C 28/04 | (2006.01) | |
| C23C 16/36 | (2006.01) | |
| C23C 16/40 | (2006.01) | |

(52) U.S. Cl.
CPC ............ B23B 27/14 (2013.01); C23C 16/34 (2013.01); C23C 16/36 (2013.01); C23C 16/403 (2013.01); C23C 28/042 (2013.01); C23C 28/044 (2013.01); C23C 28/42 (2013.01); C23C 28/44 (2013.01); Y10T 428/24975 (2015.01)

(58) Field of Classification Search
USPC ............ 51/307, 309; 428/216, 336, 469, 472, 428/697, 698, 699, 701, 702
See application file for complete search history.

(56) References Cited

U.S. PATENT DOCUMENTS

| | | | | |
|---|---|---|---|---|
| 5,075,181 | A | * | 12/1991 | Quinto et al. ................. 428/469 |
| 5,296,016 | A | * | 3/1994 | Yoshimura et al. ............. 75/245 |
| 5,503,912 | A | * | 4/1996 | Setoyama et al. ............. 428/216 |
| 5,915,162 | A | * | 6/1999 | Uchino et al. ................. 428/699 |
| 6,156,383 | A | * | 12/2000 | Ishii et al. ................. 427/255.11 |
| 2003/0108752 | A1 | * | 6/2003 | Konig et al. .................. 428/469 |
| 2010/0255337 | A1 | | 10/2010 | Langhorn |

FOREIGN PATENT DOCUMENTS

| | | |
|---|---|---|
| JP | H04-033865 A | 2/1992 |
| JP | H07-136808 A | 5/1995 |
| JP | H09-177806 A | 5/1997 |
| JP | H10 180506 | 7/1998 |
| JP | H10-180506 A | 7/1998 |
| JP | H11 172464 A | 6/1999 |
| JP | 2000-176706 A | 6/2000 |
| JP | 2007-245269 A | 9/2007 |
| JP | 2010-253594 A | 11/2010 |
| WO | WO 00/52225 A1 | 9/2000 |

OTHER PUBLICATIONS

Extended search report issued in European counterpart application (No. 12774455.5).
International Search Report dated Jul. 17, 2012 issued in PCT counterpart application (No. PCT/JP2012/060651).
International Preliminary Report on Patentability (IPRP) dated Oct. 22, 2013 issued in PCT counterpart application (No. PCT/JP2012/060651).

\* cited by examiner

*Primary Examiner* — Archene Turner
(74) *Attorney, Agent, or Firm* — Womble Carlyle Sandridge & Rice PLLC

(57) ABSTRACT

A coated cutting tool with improved abrasion resistance and chipping resistance in which a cemented carbine substrate has a coating film formed on a surface of the substrate by chemical vapor deposition. The coating film includes a lower film with the average film thickness of 2 to 15 μm, formed on the surface of the substrate, and an aluminum oxide upper film, with an average film thickness of 1 to 10 μm, formed on a surface of the lower film. The lower film is an alternate laminated film formed by alternately stacking TiN films; each having the average thickness of 10 to 300 nm, and TiCN films each having the average thickness of 0.1 to 0.5 μm.

18 Claims, No Drawings

COATED CUTTING TOOL

RELATED APPLICATIONS

This is a 371 US National Phase of International Patent Application No. PCT/JP2012/060651, filed Apr. 20, 2012, and published as WO 2012/144574A1 on Oct. 26, 2012, which claims priority to JP 2011-093560, filed Apr. 20, 2011. The contents of the aforementioned applications are incorporated by reference in their entirety.

TECHNICAL FIELD

The present invention relates to a coated cutting tool excellent in chipping resistance and wear resistance, for example, used in continuous cutting of a steel or cast iron, as a matter of course, and excellent in wear resistance even when it is used for milling or interrupted cutting of the above materials.

BACKGROUND ART

As a prior art technique of the coated cutting tool, there may be mentioned a cutting tool made of a surface-coated tungsten carbide-based cemented carbide which comprises a hard coating layer constituted by a titanium nitride layer and a titanium carbonitride layer each having a granular crystal structure being alternately laminated two or more layers having an average layer thickness of 3 to 10 μm on a surface of the tungsten carbide-based cemented carbide substrate, and at least one layer of the titanium carbonitride layers has a lengthwise grown crystal structure (for example, see Patent Literature 1.).

Also, a cutting tool made of a surface-coated cemented carbide which comprises a WC-based cemented carbide substrate on the surface of which being formed a multi-layered coating layer comprising an alternately laminated layers of TiN and TiCN using a chemical vapor deposition method with a layer thickness of 1 to 5 μm may be mentioned as the prior art technique of the coated cutting tool (for example, see Patent Literature 2.).

PRIOR ART REFERENCES

Patent Literatures

[Patent Literature 1] JP H07-136808A
[Patent Literature 2] JP H04-033865B

SUMMARY OF THE INVENTION

Problems to be Solved by the Invention

In recent years, in the field of machining, demand for the quality of a work piece material after processing, in particular, improvement in precision of machining dimension has been increasing. Further, higher hardening of the work piece material has been advanced every year, and in the conventional cutting tools disclosed in the above-mentioned Patent Literature 1 or Patent Literature 2, in the cutting device to which the tool has been attached, recession of the position of the cutting edge of the tool at a relief surface is likely caused by wear or chipping. Therefore, machining dimension of the work piece material tends to go beyond the bounds of the standard scope within a short period of the processing time.

In the processing field, to correct deviation of the machining dimension of a work piece material, correction of the position of the cutting edge of the tool has been frequently done. However, correction of the position of the cutting edge of the tool worsens processing efficiency, so that it has been desired to develop a cutting tool in which recession of the position of the cutting edge of the tool is unlikely caused than before from the processing field.

Thus, an object of the present invention is to provide a coated cutting tool excellent in wear resistance and chipping resistance, in which recession of a position of a cutting edge of the tool due to wear or chipping is unlikely to occur.

Means to Solve the Problems

The present inventor has carried out research and development to reduce recession of a position of a cutting edge of the tool by wear or chipping, and as a result, he has found out that a coated cutting tool obtained by forming, on the surface of a cemented carbide substrate, a lower film comprising alternately laminated film which comprises a TiN film having an average film thickness of 10 to 300 nm and a TiCN film having an average film thickness of 0.1 to 0.5 μm by the chemical vapor deposition method, and further forming an upper film comprising an aluminum oxide film on the surface of the lower film has excellent wear resistance and chipping resistance.

When the coated cutting tool is used, recession of a position of the cutting edge of the tool by wear or chipping can be suppressed, whereby change in machining dimension of the work piece material can be restrained. Therefore, a number of an operation for correction of the position of the cutting edge of the tool which has been carried out to restrain change in the above-mentioned machining dimension can be reduced.

Summary of the present invention is as follows.

(1) A coated cutting tool comprising a cemented carbide substrate and a film formed on a surface of the substrate by a chemical vapor deposition method, wherein an average film thickness of the film is 3 to 20 μm, the film comprises a lower film having an average film thickness of 2 to 15 μm formed on the surface of the substrate, and an upper film having an average film thickness of 1 to 10 μm formed on a surface of the lower film on a side opposite to a surface in contact with the substrate, the lower film has an alternately laminated film in which a TiN film having an average film thickness of 10 to 300 nm and a TiCN film having an average film thickness of 0.1 to 0.5 μm are alternately laminated, and the upper film has an aluminum oxide film.

(2) The coated cutting tool described in (1), wherein the upper film has an intermediate film comprising at least one metal compound selected from the group consisting of a carbide of Ti, a carboxide of Ti, a carbonitroxide of Ti, a carboxide containing Ti and Al and a carbonitroxide containing Ti and Al, and the intermediate film is contacted with the lower film.

(3) The coated cutting tool described in (1) or (2), wherein a hardness of the alternately laminated film is 28 GPa to 40 GPa.

(4) The coated cutting tool described in any one of (1) to (3), wherein a tensile residual stress of the TiCN film in the alternately laminated film measured by a $\sin^2\Psi$ method of an X-ray diffraction measurement is 400 MPa or less.

(5) The coated cutting tool described in any one of (1) to (4), wherein the aluminum oxide film is an α type aluminum oxide film.

(6) The coated cutting tool described in any one of (1) to (5), wherein an arithmetic mean roughness Ra of the surface of the upper film on a side opposite to a surface in contact with the lower film is 0.03 to 0.3 μm in the coated cutting tool.

(7) The coated cutting tool described in any one of (1) to (6), wherein an average film thickness of the film is 3.5 to 18 μm.

(8) The coated cutting tool described in any one of (1) to (7), wherein an average film thickness of the lower film is 2 to 13 μm.
(9) The coated cutting tool described in any one of (1) to (8), wherein an average film thickness of the TiN film in the alternately laminated film is 10 to 250 nm.
(10) The coated cutting tool described in any one of (1) to (9), wherein an average film thickness of the TiCN film in the alternately laminated film is 0.15 to 0.4 μm.
(11) The coated cutting tool described in any one of (1) to (10), wherein an average film thickness of the alternately laminated film is 2 to 15 μm.
(12) The coated cutting tool described in any one of (1) to (11), wherein a number of the laminated layers of the TiN film and the TiCN film of the alternately laminated film is 4 to 120 layers.
(13) The coated cutting tool described in any one of (2) to (12), wherein an average film thickness of the intermediate film is 0.1 to 2 μm.
(14) The coated cutting tool described in any one of (2) to (13), wherein the intermediate film is a film comprising TiC, TiCO, TiCNO, TiAlCO or TiAlCNO.

Effects of the Invention

The coated cutting tool of the present invention shows excellent wear resistance and chipping resistance. When the coated cutting tool of the present invention is used, in a cutting device to which the tool has been attached, recession of a position of the cutting edge of the tool by wear or chipping can be restrained, change in machining dimension of a work piece material is unlikely caused, and a number of correction times of the position of the cutting edge of the tool can be reduced, whereby it leads to improvement in productivity of various kinds of processing products.

EMBODIMENTS TO CARRY OUT THE INVENTION

[Coated Cutting Tool]
The coated cutting tool of the present invention comprises a cemented carbide substrate, and a coating formed on the surface of the cemented carbide substrate by the chemical vapor deposition method.
[Cemented Carbide Substrate]
The above-mentioned cemented carbide substrate is, for example, a cemented carbide obtained by sintering a mixed powder of a hard phase-forming powder comprising WC, and at least one selected from the group consisting of a carbide, a nitride and a carbonitride of Ti, Zr, Hf, V, Nb, Ta, Cr, Mo and W and mutual solid solutions thereof, and a binder phase-forming powder comprising Co.
The cemented carbide thus obtained is constituted by a hard phase of WC and a binder phase comprising Co as a main component, or, a hard phase of WC, a hard phase comprising at least one selected from the group consisting of a carbide, a nitride and a carbonitride of Ti, Zr, Hf, V, Nb, Ta, Cr, Mo and W and mutual solid solutions thereof, and a binder phase comprising Co as a main component.
Also, if a β-free layer comprising a hard phase of WC and a binder phase containing Co as a main component is formed at the neighbor of the surface of the cemented carbide substrate comprising a hard phase of WC, a hard phase (β phase) comprising at least one selected from the group consisting of a carbide, a nitride, a carbonitride each containing two or more kinds of metal elements selected from the group consisting of Ti, Zr, Hf, V, Nb, Ta, Cr, Mo and W, and mutual solid solutions thereof, and a binder phase containing Co as a main component, the coated cutting tool of the present invention shows excellent toughness, and shows excellent wear resistance for the long time of the use without generating uneven wear, fracture, etc.

If the average thickness of the β-free layer is less than 1 μm, fracture resistance of the coated cutting tool of the present invention tends to be lowered, while if it exceeds 30 μm, plastic deformation resistance of the coated cutting tool tends to be lowered. Therefore, in the present invention, the average thickness of the β-free layer is preferably set to 1 to 30 μm, and among these, the average thickness of the β-free layer is more preferably 5 to 25 μm in the viewpoint of improving fracture resistance.

In addition, a thickness of the cemented carbide substrate explained above is not particularly limited, and generally 1 to 120 mm.

[Film]
The film constituting the coated cutting tool of the present invention is formed by the chemical vapor deposition method. If it is formed by the chemical vapor deposition method, adhesion strength between the substrate and the film can be heightened. This is because, it can be considered that the temperature of the chemical vapor deposition method is high, so that diffusion of the cemented carbide substrate component is generated at the interface between the substrate and the film. Therefore, if the film is formed by the chemical vapor deposition method, a coated cutting tool excellent in peeling resistance and chipping resistance can be obtained as compared with the film formed by the physical vapor deposition method.

If an average film thickness of the film constituting the coated cutting tool of the present invention is less than 3 μm, wear resistance of the coated cutting tool is lowered, while if it exceeds 20 μm, cutting edge is likely chipped. Therefore, in the present invention, an average film thickness of the film is set to be 3 to 20 μm.

Incidentally, in the present specification, the average film thickness can be obtained by measuring thicknesses at the optional five portions from the cross section of the film using a transmission type electron microscope, and obtaining an average value thereof. Hereinafter the same is applied.

Also, in the coated cutting tool of the present invention, an average film thickness of the film is preferably 3.5 to 18 μm in the view points of accomplishing excellent wear resistance and restraining chipping.

<Lower Film>
The film is constituted by the lower film and the upper film, and the lower film is formed on the surface of the cemented carbide substrate by the chemical vapor deposition method. If an average film thickness of the lower film is less than 2 μm, wear resistance of the coated cutting tool is lowered, while if it exceeds 15 μm, chipping is likely caused from the peeled portion of the film as a starting point. Therefore, in the present invention, the average film thickness of the lower film is to be 2 to 15 μm.

In the coated cutting tool of the present invention, the average film thickness of the lower film is preferably 2 to 13 μm in the view points of accomplishing excellent wear resistance and restraining chipping.

(Alternately Laminated Film)
Such a lower film comprises an alternately laminated film in which a TiN film having an average film thickness of 10 to 300 nm and a TiCN film having an average film thickness of 0.1 to 0.5 μm are alternately laminated. The TiN film is excellent in toughness, and the TiCN film is excellent in wear resistance, so that by using the alternately laminated film thereof, both of toughness and wear resistance of the coated cutting tool of the present invention can be improved.

In the alternately laminated film, it is extremely difficult to form the TiN film having an average film thickness of less than 10 nm by the chemical vapor deposition method, while if an average film thickness of the TiN film exceeds 300 nm, wear resistance of the coated cutting tool is lowered. From this reason, the average film thickness of the TiN film of the alternately laminated film is to be 10 to 300 nm. Incidentally, the average film thickness of the TiN film is preferably 10 to 250 nm in the view point of wear resistance of the coated cutting tool.

Next, in the alternately laminated film, if an average film thickness of the TiCN film is less than 0.1 μm, wear resistance of the coated cutting tool of the present invention is lowered, while if the average film thickness thereof exceeds 0.5 μm, chipping is likely caused from the peeled portion of the alternately laminated film as a starting point. From the above, an average film thickness of the TiCN film of the alternately laminated film is set to 0.1 to 0.5 μm. Incidentally, in the coated cutting tool, the average film thickness of the TiCN film is preferably 0.15 to 0.4 μm in the view points of accomplishing excellent wear resistance and restraining chipping.

If the average film thickness of the whole alternately laminated film in which the TiN film and the TiCN film are alternately laminated as explained above is less than 2 μm, wear resistance of the coated cutting tool of the present invention is lowered, while if the average film thickness exceeds 15 μm, chipping is likely caused from the peeled portion of the film as a starting point. Therefore, the average film thickness of the whole alternately laminated film is preferably 2 to 15 μm.

Further, a number of the laminated layers of the TiN film and the TiCN film in the alternately laminated film is generally 4 to 120 layers, preferably 10 to 100 layers, in the viewpoint of wear resistance of the coated cutting tool of the present invention. Here, the number of the laminated layers represents a number of layers in total when the TiN film is counted as one layer and the TiCN film is counted as one layer.

When the alternately laminated film is contacted with the cemented carbide substrate, either of the TiN film or the TiCN film may be contacted with the substrate. Incidentally, in the viewpoint of adhesiveness, the TiN film is preferably contacted with the substrate.

Also, as mentioned hereinbelow, an upper film is formed on the lower film, and when the alternately laminated film is contacted with the upper film, either of the TiN film or the TiCN film may be contacted with the upper film. Incidentally, in the viewpoint of adhesiveness, the TiCN film is preferably contacted with the upper film.

If the hardness of the alternately laminated film exceeds 40 GPa, toughness of the alternately laminated film is lowered, and a tendency can be observed that chipping is likely caused from the peeled portion of the alternately laminated film as a starting point. To the contrary, if the hardness of the alternately laminated film is low and is less than 28 GPa, wear resistance of the coated cutting tool of the present invention tends to be lowered. Therefore, the hardness of the alternately laminated film is preferably 28 GPa to 40 GPa.

The hardness of the alternately laminated film can be adjusted by average film thicknesses of the TiN film and the TiCN film of the alternately laminated film. More specifically, by making average film thicknesses of the respective films of the TiN film and the TiCN film thin, the hardness of the alternately laminated film can be made high. Incidentally, the hardness of the alternately laminated film can be measured, in the coated cutting tool of the present invention, by applying a diamond indenter to the surface of the alternately laminated film which is obtained by removing the films (the upper film, etc.) coated on the surface side of the alternately laminated film by polishing.

A coefficient of thermal expansion of the alternately laminated film is larger than a coefficient of thermal expansion of the cemented carbide substrate, so that a tensile residual stress is generated to the alternately laminated film when the coated cutting tool of the present invention is manufactured. Further, TiN and TiCN have a different coefficient of thermal expansion, so that the tensile residual stress of the TiN film and the tensile residual stress of the TiCN film are different from each other.

Thus, when residual stress of the TiCN film of the alternately laminated film having sufficiently large average film thickness to measure the residual stress is measured, if the tensile residual stress of the TiCN film exceeds 400 MPa, a tendency of lowering in chipping resistance can be observed. From this reason, tensile residual stress of the TiCN film of the alternately laminated film according to the present invention is preferably 400 MPa or less. Also, tensile residual stress of the TiCN film is generally 100 MPa to 600 MPa.

The tensile residual stress of the TiCN film of the alternately laminated film can be measured by the conventionally known $\sin^2\Psi$ method of the X-ray diffraction measurement. Also, the Young's modulus of the TiCN film necessary for calculating the tensile residual stress by the $\sin^2\Psi$ method is measured by the dynamic hardness tester, etc. In addition, the Poisson's ratio of the TiCN film is to be made 0.2. Incidentally, if tensile residual stress of the TiCN film in the alternately laminated film cannot be measured since the TiCN film which is not included in the alternately laminated film is formed at the side nearer to the surface which is opposed to the substrate of the coated cutting tool of the present invention than the alternately laminated film, the TiCN film which is not included in the alternately laminated film is removed by polishing, etc., to measure the stress.

Incidentally, for making the tensile residual stress of the TiCN film 400 MPa or less, the alternately laminated film is so constituted that the TiN film having an average film thickness of 10 to 300 nm and the TiCN film having an average film thickness of 0.1 to 0.5 μm are alternately laminated.

<Upper Film>

An upper film is formed on the surface of the lower film which constitutes the coated cutting tool of the present invention, which surface is opposed to the side of the surface contacting with the cemented carbide substrate. The upper film of the present invention has an aluminum oxide film, so that crater wear resistance of the coated cutting tool is improved.

If the average film thickness of the upper film is less than 1 μm, crater wear resistance of the rake face of the coated cutting tool of the present invention is not improved, while if the average film thickness thereof exceeds 10 μm, cutting edge is likely fractured. From this reason, an average film thickness of the upper film is to be 1 to 10 μm.

Incidentally, a crystal form of the aluminum oxide film in the upper film is not particularly limited to α type, κ type or γ type, and α type which is stable at high temperatures is preferred. In particular, when the cutting edge becomes high temperatures such as high speed cutting of carbon steel or alloy steel, if the aluminum oxide film is an α type aluminum oxide film, fracture or chipping unlikely occurs.

If the average film thickness of such an aluminum oxide film is less than 0.5 μm, crater wear resistance at the rake face of the coated cutting tool is not improved, while if the average film thickness thereof exceeds 10 μm, cutting edge is likely fractured. From this reason, an average film thickness of the aluminum oxide film is preferably 0.5 to 10 μm, more preferably 0.5 to 8 μm.

(Intermediate Film)

The coated cutting tool of the present invention has an intermediate film comprising at least one metal compound selected from the group consisting of a carbide of Ti, a carboxide of Ti, a carbonitroxide of Ti, a carboxide containing Ti and Al and a carbonitroxide containing Ti and Al, as a layer constituting the upper film, and the intermediate film is preferably contacted with the above-mentioned lower film.

When an intermediate film with such a constitution is present, adhesiveness between the lower film and the upper film is improved. Incidentally, an average film thickness of the intermediate film is generally 0.1 to 2 μm, more preferably 0.3 to 1.0 μm. The intermediate film may be a laminated film of a plural number of the films comprising the various metal compounds mentioned above.

As the above-mentioned intermediate film, there may be specifically mentioned a film comprising TiC, TiCO, TiCNO, TiAlCO or TiAlCNO. Among these, a film comprising a carbonitroxide containing Ti and Al is more preferred. As the intermediate film comprising a carbonitroxide containing Ti and Al, there may be specifically mentioned TiAlCNO.

Moreover, when the intermediate film is formed at the surface opposite to the surface contacting with the cemented carbide substrate of the lower film, and the aluminum oxide film is formed at the surface opposite to the surface contacting with the lower film of the intermediate film, adhesiveness of the aluminum oxide film and the lower film is improved so that it is more preferred.

(Surface Film)

Also, to make discrimination of the used corner of the coated cutting tool easy, a surface film comprising at least one selected from the group consisting of a carbonitride and a nitride of Ti is more preferably formed on the surface of the aluminum oxide film at the side opposite to the surface contacting with the intermediate film.

Incidentally, the surface film may be a laminated film comprising a plural number of the film comprising a carbonitride of Ti and the film comprising a nitride of Ti. Also, the forming method of the surface film is conventionally known, and various known conditions of the chemical deposition may be employed. An average film thickness of such a surface film is generally 0.1 to 5 μm.

[Preparation Method of Film]

As a preparation method of the respective films constituting the film of the coated cutting tool of the present invention, there may be mentioned, for example, the following methods.

The TiN film which constitutes the alternately laminated film of the lower film can be formed by the chemical vapor deposition method using the starting gas composition comprising $TiCl_4$: 5.0 to 10.0 mol %, $N_2$: 20 to 60 mol % and $H_2$: the remainder, at a temperature of 850 to 920° C. and a pressure of 100 to 350 hPa.

Also, the TiCN film which constitutes the alternately laminated film can be formed by the chemical vapor deposition method using the starting gas composition comprising $TiCl_4$: 10 to 15 mol %, $CH_3CN$: 1 to 3 mol %, $N_2$: 0 to 20 mol % and $H_2$: the remainder, at a temperature of 850 to 920° C. and a pressure of 60 to 100 hPa.

The α type aluminum oxide film in the upper film can be formed by the chemical vapor deposition method using the starting gas composition comprising $AlCl_3$: 2.1 to 5.0 mol %, $CO_2$: 2.5 to 4.0 mol %, HCl: 2.0 to 3.0 mol %, $H_2S$: 0.28 to 0.45 mol % and $H_2$: the remainder, at a temperature of 900 to 1000° C. and a pressure of 60 to 80 hPa.

Incidentally, the κ type aluminum oxide film can be formed by the chemical vapor deposition method using the starting gas composition comprising $AlCl_3$: 2.0 to 5.0 mol %, $CO_2$: 4.2 to 6.0 mol %, CO: 3.0 to 6.0 mol %, HCl: 3.5 to 5.0 mol %, $H_2S$: 0.3 to 0.5 mol % and $H_2$: the remainder, at a temperature of 900 to 1020° C. and a pressure of 60 to 80 hPa.

The TiAlCNO film, TiC film, TiCO film, TiCNO film and TiAlCO film which can be mentioned as the intermediate film may be formed as follows.

The TiAlCNO film can be formed by the chemical vapor deposition method using the starting gas composition comprising $TiCl_4$: 3.0 to 5.0 mol %, $AlCl_3$: 1.0 to 2.0 mol %, CO: 0.4 to 1.0 mol %, $N_2$: 30 to 40 mol % and $H_2$: the remainder, at a temperature of 975 to 1025° C. and a pressure of 90 to 110 hPa.

The above-mentioned TiC film can be formed by the chemical vapor deposition method using the starting gas composition comprising $TiCl_4$: 1.0 to 3.0 mol %, $CH_4$: 4.0 to 6.0 mol % and $H_2$: the remainder, at a temperature of 990 to 1030° C. and a pressure of 50 to 100 hPa.

The above-mentioned TiCO film can be formed by the chemical vapor deposition method using the starting gas composition comprising $TiCl_4$: 1.2 to 3.2 mol %, CO: 3.0 to 5.0 mol % and $H_2$: the remainder, at a temperature of 960 to 1025° C. and a pressure of 170 to 210 hPa.

The above-mentioned TiCNO film can be formed by the chemical vapor deposition method using the starting gas composition comprising $TiCl_4$: 1.0 to 3.0 mol %, CO: 2.0 to 4.0 mol %, $N_2$: 4 to 6 mol % and $H_2$: the remainder, at a temperature of 960 to 1025° C. and a pressure of 60 to 100 hPa.

The above-mentioned TiAlCO film can be formed by the chemical vapor deposition method using the starting gas composition comprising $TiCl_4$: 0.5 to 1.5 mol %, $AlCl_3$: 3.0 to 5.0 mol %, CO: 2.0 to 4.0 mol % and $H_2$: the remainder, at a temperature of 975 to 1025° C. and a pressure of 60 to 100 hPa.

[Surface Roughness at the Surface of the Coated Cutting Tool]

By adjusting the surface roughness of the cemented carbide substrate constituting the coated cutting tool of the present invention and forming conditions of the films, an arithmetic mean roughness Ra of the surface of the coated cutting tool, more specifically, the surface opposed to the side of the face contacting with the lower film of the upper film of the tool can be adjusted. According to this procedure, welding of the work piece material to the coated cutting tool can be restrained.

The arithmetic mean roughness Ra at the surface of the coated cutting tool is usually 0.03 to 0.5 μm, and preferably 0.03 to 0.3 μm.

Also, it is preferred that the surface of the above-mentioned coated cutting tool is subjected to surface treatment such as polishing by a grindstone and polishing by wet blast, to adjust the arithmetic mean roughness Ra at the surface of the coated cutting tool to 0.03 to 0.3 μm. Incidentally, in the present specification, the arithmetic mean roughness Ra is a value measured according to JIS B0601 (2001).

EXAMPLES

In the following, the present invention is explained in more detail by referring to Examples.

[Production of Coated Cutting Tool]

A mixed powder comprising 89% by weight of WC powder having an average particle size of 4.5 μm, 2% by weight of TiCN powder having an average particle size of 1.5 μm, 2% by weight of (Ta,Nb)C powder having an average particle size of 1.5 μm and 7% by weight of Co powder having an average particle size of 1.5 μm was sintered to obtain a WC-(Ti,W,Ta,Nb)(C,N)—Co series cemented carbide.

The cemented carbide was processed to an ISO standard CNMG 120412 shaped insert to obtain a cemented carbide substrate. Incidentally, at the neighbor of the surface of the cemented carbide substrate, a β-free layer comprising WC and Co had been formed. An average thickness of the β-free layer at the flank surface of the cemented carbide substrate was 15 μm. On the cemented carbide substrate was formed a film having a film constitution shown in the following Table 1 by the chemical vapor deposition method (excluding Comparative product 10).

In Table 1, a number of the laminated layers of the alternately laminated film is shown to be a total number of the layers be formed, when the TiN film is counted as one layer and the TiCN film is counted as one layer.

The TiN film of the alternately laminated film was formed by using the starting gas composition comprising $TiCl_4$: 9.0 mol %, $N_2$: 40 mol % and $H_2$: the remainder, under the conditions of a temperature of 900° C. and a pressure of 160 hPa.

The TiCN film of the alternately laminated film was formed by using the starting gas composition comprising $TiCl_4$: 10.8 mol %, $CH_3CN$: 1.3 mol %, $N_2$: 13.5 mol % and $H_2$: the remainder, under the conditions of a temperature of 900° C. and a pressure of 90 hPa.

TABLE 1

| | Film | | | | | | | | | |
|---|---|---|---|---|---|---|---|---|---|---|
| | Lower film | | | Upper film | | | | | | |
| | Alternately laminated film | | Whole layer | Intermediate | Aluminum oxide | Surface | Surface | Whole layer thickness | Total film thickness | |
| Sample No. | TiN (nm) | TiCN (μm) | Number of laminated layers | thickness (μm) of lower film | film TiAlCNO (μm) | film $Al_2O_3$ (μm) | film TiCN (μm) | film TiN (μm) | (μm) of upper film | of whole film (μm) | Surface treatment |
| Present product 1 | 200 | 0.20 | 10 | 2.0 | 0.3 | 0.5 (α) | 0.0 | 0.2 | 1.0 | 3.0 | Polishing |
| Present product 2 | 200 | 0.20 | 60 | 12.0 | 1.0 | 6.0 (α) | 0.5 | 0.5 | 8.0 | 20.0 | Polishing |
| Present product 3 | 100 | 0.20 | 100 | 15.0 | 0.5 | 1.0 (α) | 0.0 | 0.5 | 2.0 | 17.0 | Polishing |
| Present product 4 | 200 | 0.20 | 40 | 8.0 | 1.0 | 8.0 (α) | 0.5 | 0.5 | 10.0 | 18.0 | Polishing |
| Present product 5 | 300 | 0.30 | 30 | 9.0 | 0.3 | 0.5 (α) | 0.0 | 0.2 | 1.0 | 10.0 | Polishing |
| Present product 6 | 10 | 0.50 | 28 | 7.14 | 1.0 | 5.0 (α) | 0.5 | 0.5 | 7.0 | 14.1 | Polishing |
| Present product 7 | 200 | 0.10 | 48 | 7.2 | 1.0 | 5.0 (α) | 0.5 | 0.5 | 7.0 | 14.2 | Polishing |
| Present product 8 | 200 | 0.20 | 40 | 8.0 | 1.0 | 5.0 (κ) | 0.5 | 0.5 | 7.0 | 15.0 | Polishing |
| Present product 9 | 300 | 0.50 | 20 | 8.0 | 1.0 | 5.0 (α) | 0.5 | 0.5 | 7.0 | 15.0 | Polishing |
| Present product 10 | 200 | 0.20 | 40 | 8.0 | 1.0 | 5.0 (α) | 0.5 | 0.5 | 7.0 | 15.0 | None |
| Present product 11 | 200 | 0.20 | 40 | 8.0 | 1.0 | 5.0 (α) | 0.5 | 0.5 | 7.0 | 15.0 | Blast |
| Comparative product 1 | 200 | 8.00 | 2 | 8.2 | 1.0 | 4.0 (α) | 0.5 | 0.5 | 6.0 | 14.2 | Polishing |
| Comparative product 2 | 300 | 0.30 | 4 | 1.2 | 0.3 | 0.5 (α) | 0.0 | 0.2 | 1.0 | 2.2 | Polishing |
| Comparative product 3 | 300 | 0.30 | 44 | 13.2 | 1.0 | 5.0 (α) | 0.5 | 0.5 | 7.0 | 20.2 | Polishing |
| Comparative product 4 | 350 | 0.20 | 30 | 8.25 | 1.0 | 5.0 (α) | 0.5 | 0.5 | 7.0 | 15.3 | Polishing |
| Comparative product 5 | 200 | 0.05 | 48 | 6.0 | 1.0 | 5.0 (α) | 0.5 | 0.5 | 7.0 | 13.0 | Polishing |
| Comparative product 6 | 200 | 0.55 | 22 | 8.25 | 1.0 | 5.0 (α) | 0.5 | 0.5 | 7.0 | 15.3 | Polishing |
| Comparative product 7 | 200 | 0.20 | 80 | 16.0 | 0.5 | 1.0 (α) | 0.0 | 0.5 | 2.0 | 18.0 | Polishing |
| Comparative product 8 | 200 | 0.20 | 60 | 12.0 | 0.3 | 0.3 (α) | 0.0 | 0.2 | 0.8 | 12.8 | Polishing |
| Comparative product 9 | 200 | 0.20 | 30 | 6.0 | 1.0 | 9.0 (α) | 0.5 | 0.5 | 11.0 | 17.0 | Polishing |
| Comparative product 10 | TiAlN film (average film thickness: 10.0 μm) by physical deposition method | | | | | | | | | | |

*The film thicknesses are all an average film thickness.
*In the obtained films, the TiN film in the alternately laminated film is contacted with the cemented carbide substrate, the TiCN film in the alternately laminated film is contacted with the intermediate film, the intermediate film is contacted with the aluminum oxide film, and the TiCN film and/or TiN film which is/are the surface film is/are laminated in this order on the surface opposed to the side of the surface contacting with the intermediate film of the aluminum oxide film.

Under these coating conditions, the TiN film and the TiCN film were alternately laminated until these became a predetermined number of the laminated layers. Incidentally, the lower films comprise an alternately laminated film alone in both of Present products and Comparative products.

The TiAlCNO film of the intermediate film was formed by using the starting gas composition comprising $TiCl_4$: 4.0 mol %, $AlCl_3$: 1.2 mol %, CO: 0.6 mol %, $N_2$: 34 mol % and $H_2$: the remainder, under the conditions of a temperature of 1000° C. and a pressure of 100 hPa.

The α type aluminum oxide film of the upper film was formed by using the starting gas composition comprising $AlCl_3$: 2.3 mol %, $CO_2$: 3.6 mol %, HCl: 2.0 mol %, $H_2S$: 0.3 mol % and $H_2$: the remainder, under the conditions of a temperature of 1000° C. and a pressure of 70 hPa.

The κ type aluminum oxide film (Present product 8) of the upper film was formed by using the starting gas composition comprising $AlCl_3$: 2.5 mol %, $CO_2$: 4.5 mol %, CO: 4.4 mol %, HCl: 4.0 mol %, $H_2S$: 0.4 mol % and $H_2$: the remainder, under the conditions of a temperature of 1000° C. and a pressure of 70 hPa.

The TiCN film of the upper film was formed by using the starting gas composition comprising $TiCl_4$: 7.3 mol %, $N_2$: 11.6 mol %, $CH_3CN$: 1.2 mol % and $H_2$: the remainder, under the conditions of a temperature of 1000° C. and a pressure of 90 hPa.

The TiN film of the upper film was formed by using the starting gas composition comprising $TiCl_4$: 9.0 mol %, $N_2$: 40 mol % and $H_2$: the remainder, under the conditions of a temperature of 1000° C. and a pressure of 160 hPa.

In Comparative product 10, the TiAlN film was formed by the physical vapor deposition method, the TiAlN film was peeled off from the cemented carbide substrate at the cutting edge of the coated cutting tool before subjecting to the machining test, so that the cutting properties could not be evaluated. In addition, measurement of an arithmetic mean roughness Ra, etc., of the surface of the sample shown below was not also carried out. The reason why the TiAlN film was naturally peeled off before the machining test can be considered that adhesive strength between the TiAlN film and the substrate was not sufficient, and compressive residual stress of the TiAlN film was extremely high.

[Measurement of Characteristics]

An arithmetic mean roughness Ra at the surface of the coated cutting tool sample (the surface at the side opposite to the surface contacting with the lower film of the upper film) obtained by the chemical vapor deposition method as mentioned above was measured by using a surface property measuring instrument (SURFPAK-SV) manufactured by Mitutoyo Corporation.

Further, the upper film at the sample surface was removed by diamond lap grinding, and a hardness of the alternately laminated film revealed to the surface was measured by using a dynamic hardness meter (NANOINDENTER manufactured by MTS Corporation).

Further, a tensile residual stress of the TiCN film in the alternately laminated film was measured by using an X-ray diffraction device (RINT-TTRIII) manufactured by RIGAKU according to the $sin^2\Psi$ method.

These measurement results are shown in the following Table 2.

TABLE 2

| Sample No. | Tensile residual stress (MPa) of TiCN film constituting alternately laminated film | Arithmetic mean roughness Ra (μm) of sample surface | Hardness (GPa) of alternately laminated film |
| --- | --- | --- | --- |
| Present product 1 | 280 | 0.05 | 32.6 |
| Present product 2 | 183 | 0.30 | 35.0 |
| Present product 3 | 149 | 0.35 | 39.5 |
| Present product 4 | 181 | 0.48 | 31.2 |
| Present product 5 | 351 | 0.13 | 28.2 |
| Present product 6 | 378 | 0.15 | 29.0 |
| Present product 7 | 104 | 0.15 | 39.8 |
| Present product 8 | 180 | 0.10 | 34.7 |
| Present product 9 | 396 | 0.20 | 28.1 |
| Present product 10 | 175 | 0.35 | 35.2 |
| Present product 11 | 15 | 0.28 | 35.4 |
| Comparative product 1 | 500 | 0.25 | 26.8 |
| Comparative product 2 | 396 | 0.10 | 28.2 |
| Comparative product 3 | 232 | 0.34 | 28.0 |
| Comparative product 4 | 383 | 0.15 | 26.5 |
| Comparative product 5 | 118 | 0.13 | 38.0 |
| Comparative product 6 | 415 | 0.20 | 27.3 |
| Comparative product 7 | 154 | 0.50 | 34.7 |
| Comparative product 8 | 177 | 0.15 | 34.8 |
| Comparative product 9 | 215 | 0.35 | 35.1 |

Compositions of the films of the coated cutting tools of Present products 1 to 11 and Comparative products 1 to 9 were measured by an energy dispersion X-ray analyzer attached to a transmission electron microscope. Also, when an average film thickness (an average value of 5 portions) of the respective films was measured from the cross-section of the film by using the transmission electron microscope, then, each showed the same value as the target film thickness (the value shown in Table 1). Moreover, when a crystal form of the aluminum oxide film was examined by using an X-ray diffractometer, then, the objective crystal form (that shown in Table 1) could be obtained in each case.

[Cutting Test]

As a machining test, two samples were prepared for each sample, cylindrical S53C (hardness: $H_B 270$) having a diameter of 120 mm and a length of 400 mm was used as a work piece material, and an edge cutting was carried out by the following mentioned cutting conditions.

<Cutting Conditions>

Cutting speed: 200 m/min,
Depth of cut: 2 mm,
Feed: 0.3 mm/rev,
Cutting atmosphere: wet (using water-soluble emulsion),
Each cutting time: 15 min,
Number of test: twice After completion of the machining test, flank wear width was measured, and the presence or absence of chipping was confirmed. The machining test was carried out twice. In the following Table 3, an average value of flank wear width of the samples and a number of the samples at which chipping occurred are shown.

TABLE 3

| | Cutting test results | |
| --- | --- | --- |
| Sample No. | Average value (mm) of flank wear width | Number of samples at which chipping occurred (number) |
| Present product 1 | 0.18 | 0 |
| Present product 2 | 0.15 | 0 |
| Present product 3 | 0.13 | 0 |

TABLE 3-continued

| Sample No. | Cutting test results | |
|---|---|---|
| | Average value (mm) of flank wear width | Number of samples at which chipping occurred (number) |
| Present product 4 | 0.17 | 0 |
| Present product 5 | 0.20 | 0 |
| Present product 6 | 0.20 | 0 |
| Present product 7 | 0.15 | 0 |
| Present product 8 | 0.18 | 0 |
| Present product 9 | 0.20 | 0 |
| Present product 10 | 0.20 | 0 |
| Present product 11 | 0.15 | 0 |
| Comparative product 1 | 0.25 | 0 |
| Comparative product 2 | 0.35 | 0 |
| Comparative product 3 | 0.80 | 2 |
| Comparative product 4 | 0.25 | 0 |
| Comparative product 5 | 0.28 | 0 |
| Comparative product 6 | 0.75 | 1 |
| Comparative product 7 | 0.92 | 2 |
| Comparative product 8 | 0.54 | 1 |
| Comparative product 9 | 1.22 | 2 |

From the results shown in Table 3, it can be understood that Present products (the coated cutting tool of the present invention) are superior to Comparative products in wear resistance and chipping resistance. Comparative products show an average value of the flank wear width of 0.25 mm or more, so that these are lower wear resistance than those of Present products. Among these, in Comparative products 3 and 6 to 9 in which chipping has generated, it can be understood that the average value of the flank wear width is 0.54 mm or more, in particular, wear resistance is low.

On the other hand, no chipping was observed in Present products, and an average value of flank wear width was 0.20 mm or less, so that it can be understood that the coated cutting tools of the present invention are excellent in chipping resistance and wear resistance.

UTILIZABILITY IN INDUSTRY

When the coated cutting tool of the present invention is used for cutting, in the cutting device to which the tool is attached, recession of the position of the cutting edge of the tool by chipping or wear can be restrained. Thus, according to the present invention, change in machining dimension of a work piece material, and a number of operations for correction of the position of the cutting edge of the tool which has conventionally been frequently carried out to suppress the same can be reduced, whereby it leads to improvement in processing productivity.

The invention claimed is:

1. A coated cutting tool comprising a cemented carbide substrate and a coating formed on a surface of the substrate by a chemical vapor deposition method,
wherein an average thickness of the coating is 3 to 20 μm, the coating comprises a lower film having an average thickness of 2 to 15 μm formed on the surface of the substrate, and an upper film having an average thickness of 1 to 10 μm formed on a surface of the lower film on a side opposite to a surface in contact with the substrate, the lower film has an alternately laminated film in which a TiN film having an average thickness of 10 to 300 nm and a TiCN film having an average thickness of 0.1 to 0.5 μm are alternately laminated, wherein a number of laminated layers of the TiN film and the TiCN film in the alternately laminated film is 4 to 120 total layers and a hardness of the alternately laminated film is 28 GPa to 40 GPa, and
the upper film has an aluminum oxide film.

2. The coated cutting tool according to claim 1, wherein the coating further comprises an intermediate film comprising at least one metal compound selected from the group consisting of a carbide of Ti, a carboxide of Ti, a carbonitroxide of Ti, a carboxide containing Ti and Al and a carbonitroxide containing Ti and Al, and
the intermediate film is contacted with the lower film and the upper film.

3. The coated cutting tool according to claim 2, wherein an average thickness of the intermediate film is 0.1 to 2 μm.

4. The coated cutting tool according to claim 2, wherein the intermediate film is a film comprising TiC, TiCO, TiCNO, TiAlCO or TiAlCNO.

5. The coated cutting tool according to claim 2, the coating further comprising a surface film comprising at least one material selected from the group consisting of a carbonitride and a nitride of Ti, the surface film formed on the surface of the upper film at the side opposite to the surface contacting with the intermediate film, the surface film having an average thickness of 0.1 to 5 μm.

6. The coated cutting tool according to claim 1, wherein a tensile residual stress of the TiCN film in the alternately laminated film measured by a $\sin^2\Psi$ method of an X-ray diffraction measurement is 400 MPa or less.

7. The coated cutting tool according to claim 1, wherein the aluminum oxide film is an α-type aluminum oxide film.

8. The coated cutting tool according to claim 1, wherein an arithmetic mean roughness Ra of the surface of the upper film on a side opposite to a surface in contact with the lower film is 0.03 to 0.3 μm in the coated cutting tool.

9. The coated cutting tool according to claim 1, wherein an average thickness of the coating is 3.5 to 18 μm.

10. The coated cutting tool according to claim 1, wherein an average thickness of the lower film is 2 to 13 μm.

11. The coated cutting tool according to claim 1, wherein an average thickness of the TiN film in the alternately laminated film is 10 to 250 nm.

12. The coated cutting tool according to claim 1, wherein an average thickness of the TiCN film in the alternately laminated film is 0.15 to 0.4 μm.

13. The coated cutting tool according to claim 1, wherein an average thickness of the alternately laminated film is 2 to 15 μm.

14. The coated cutting tool according to claim 1, wherein the cemented carbide substrate comprises a β-free surface layer with an average thickness set to 5 to 25 μm.

15. The coated cutting tool according to claim 1, wherein the TiN film is contacted with the substrate and the TiCN film is contacted with the upper film.

16. A coated cutting tool comprising a cemented carbide substrate and a coating formed on a surface of the substrate by a chemical vapor deposition method, wherein the coating comprises:
i) a lower film having an alternately laminated film comprising alternating TiN and TiCN films;
ii) an intermediate film comprising at least one metal compound selected from the group consisting of a carbide of Ti, a carboxide of Ti, a carbonitroxide of Ti, a carboxide containing Ti and Al and a carbonitroxide containing Ti and Al, the intermediate film is contacted with the lower film; and
iii) an upper film having an aluminum oxide film contacted with the intermediate film; wherein:

a number of laminated layers of the TiN film and the TiCN film in the alternately laminated film is 4 to 120 total layers;

a hardness of the alternately laminated film is 28 GPa to 40 GPa; and an arithmetic mean roughness Ra of the surface of the upper film on a side opposite to a surface in contact with the lower film is 0.03 to 0.3 µm.

17. The coated cutting tool according to claim 16, wherein:
the coating has an average thickness of 3 to 20 µm;
the lower film has an average thickness of 2 to 15 µm;
each TiN film has an average thickness of 10 to 300 nm;
each TiCN film has an average thickness of 0.1 to 0.5 µm;
the intermediate film has an average thickness of 0.1 to 2 µm; and
the upper film has an average thickness of 1 to 10 µm.

18. The coated cutting tool according to claim 16, the coating further comprising a surface film comprising at least one material selected from the group consisting of a carbonitride and a nitride of Ti, the surface film formed on the surface of the upper film at the side opposite to the surface contacting with the intermediate film.

\* \* \* \* \*